(12) United States Patent
Maddux et al.

(10) Patent No.: US 6,421,801 B1
(45) Date of Patent: Jul. 16, 2002

(54) TESTING IO TIMING IN A DELAY LOCKED SYSTEM USING SEPARATE TRANSMIT AND RECEIVE LOOPS

(75) Inventors: John T. Maddux, Folsom; Joseph H. Salmon, Placerville, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/327,942

(22) Filed: Jun. 8, 1999

(51) Int. Cl.[7] .......................... G06F 11/00; H03M 13/00
(52) U.S. Cl. ........................................ 714/744; 714/814
(58) Field of Search ................................. 714/718, 724, 714/726, 727, 728, 731, 733, 734, 735, 736, 738, 744, 745, 757, 758, 775, 324–328, 331–338, 814; 324/210, 73; 326/93, 16; 377/28; 327/141, 100

(56) References Cited

U.S. PATENT DOCUMENTS

| | | | | |
|---|---|---|---|---|
| 4,583,041 A | * | 4/1986 | Kimura ........................ 324/73 |
| 5,592,496 A | * | 1/1997 | Shimizu et al. ............... 371/27 |
| 5,614,855 A | | 3/1997 | Lee et al. .................... 327/158 |
| 5,717,353 A | | 2/1998 | Fujimoto .................... 327/276 |
| 5,894,548 A | * | 4/1999 | Horie ..................... 395/183.06 |
| 6,034,920 A | | 3/2000 | Sukegawa et al. |
| 6,229,363 B1 | * | 5/2001 | Eto et al. .................... 327/158 |

OTHER PUBLICATIONS

S Balajee and A. K. Majhi, 1997 IEEE, 1063–9667/97.*
Lee, Thomas H.; Donnelly, Kevin S.; et al., "A 2.5 V CMOS Delay–Locked Loop for an 18 Mbit, 500 Megabyte/s DRAM,," IEEE Journal of Solid–State Circuits, vol. 29, No. 12, Dec. 1994.

* cited by examiner

Primary Examiner—Albert Decady
Assistant Examiner—C R Harris
(74) Attorney, Agent, or Firm—Blakely, Sokoloff, Taylor & Zafman LLP

(57) ABSTRACT

A method and apparatus for testing an input data path of an integrated circuit. Dual transmit and receive delay locked loops (DLLs) provide clocks for test mode data transmit and receive. Test mode logic drives a data pattern into an input receiver with the data pattern clocked by the transmit DLL and the input receiver clock by the receive DLL. The output of the input receiver is compared with the data pattern. The transmit DLL is adjusted relative to the receive DLL to measure setup and hold times of the data pattern driven through the input receiver.

20 Claims, 9 Drawing Sheets

TESTING IO TIMING IN A DELAY LOCKED SYSTEM USING SEPARATE TRANSMIT AND RECEIVE LOOPS

FIELD OF THE INVENTION

This invention relates to the field of integrated circuits and, more specifically, to the testing of high speed input, paths in integrated circuits.

BACKGROUND

Test systems are used to evaluate integrated circuits to determine whether the integrated circuits meet manufacturing and design specifications. An integrated circuit is tested by connecting a test system to pads located on the integrated circuit. The integrated circuit is subjected to functional and parametric testing. Some of the testing may include the measurement of key input/output (I/O) timing parameters, such as input data setup and hold times. The tester transmits signals to stimulate the integrated circuit and then measures responses from the integrated circuit. The signals are generated by the tester using edge generators. An edge generator contains driver circuitry to produce a signal having an edge at a certain time relative to start of a timing period. A high resolution edge placement accuracy is required when testing high speed I/O paths. As such, resolution inaccuracies in the tester may effect the measurement of critical I/O timing parameters.

One prior art testing method uses an output buffer and delay element to perform relative I/O timing measurements. One problem with such a testing method is that it is susceptible to signal coupling from adjacent bondpad wires and loading from external elements, resulting in the generation of noise in a tested parameter. Such noise results in measurement inaccuracies that may cause the testing method to be unreliable.

SUMMARY OF THE INVENTION

A method and apparatus for testing an input data path of an integrated circuit is described. The method includes setting a first timing parameter of a first clock signal to match a second timing parameter of a second clock signal, the first timing parameter having a first value. The method also including applying a data pattern to the input data path to produce an output based on the first and second timing parameters, and comparing the data pattern with the output of the input data path.

Additional features and advantages of the present invention will be apparent from the accompanying drawings and from the detailed description that follows.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following description, numerous specific details are set forth such as examples of specific circuits, components, parameters, dimensions, etc. in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention.

The circuits described herein are illustrated using CMOS components. It should be noted, however, that these circuits may also be designed using Bipolar, NMOS, PMOS, or BiCMOS components. VCC and VSS are used to represent voltage supplies utilized by the circuits illustrated herein. In one embodiment, the voltage supplies VCC and VSS correspond approximately to 1.8 volts and 0 volts (ground), respectively. It should be noted that the circuits described herein may be designed utilizing other voltages.

Figure 1:
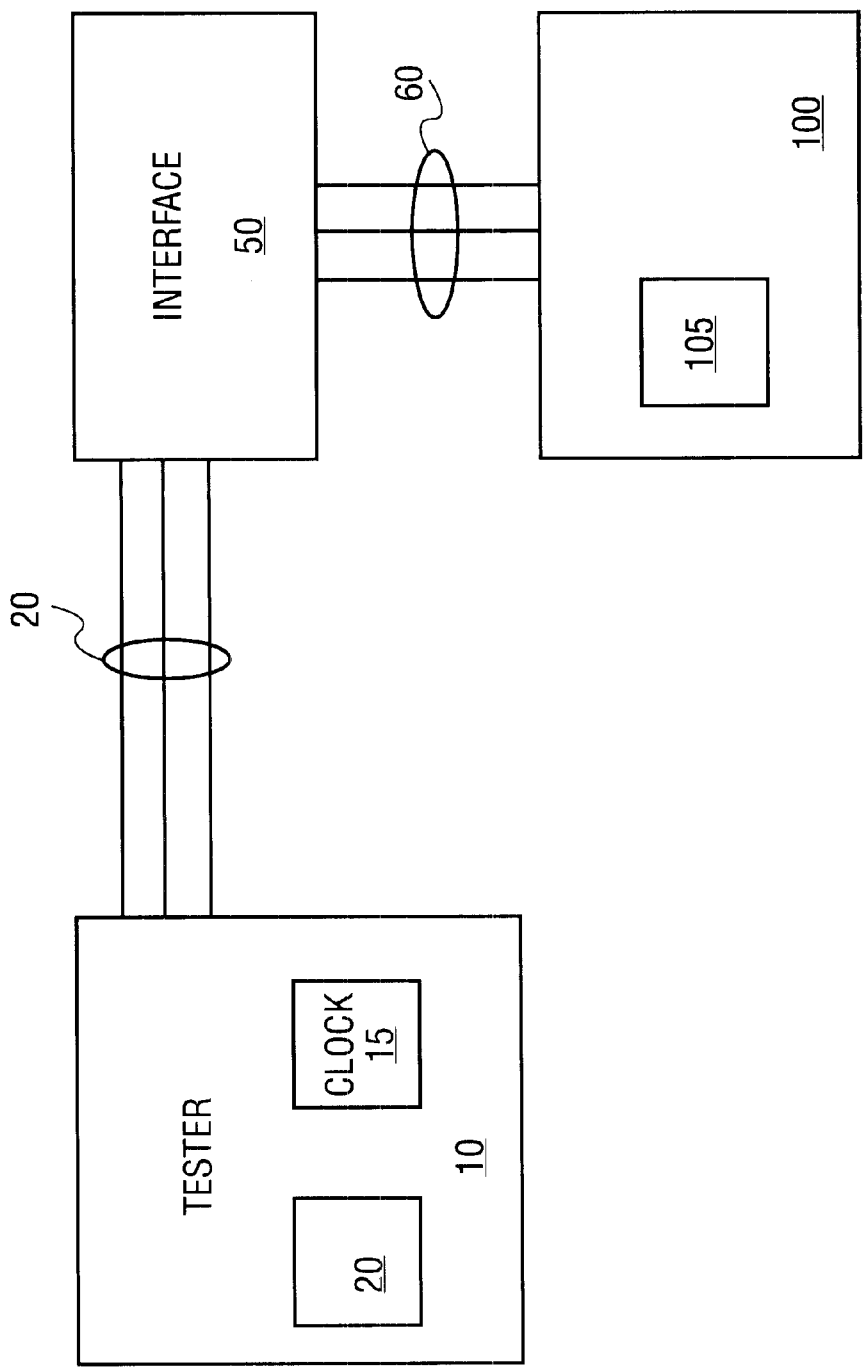
FIG. 1 illustrates one embodiment of a test system.

FIG. 1 illustrates one embodiment, of a test system. It should be noted that the components are not drawn to scale. In one embodiment, the test system includes a tester 10, an interface 50, and an integrated circuit 100. Tester 10 contains hardware and control software to perform functional and parametric testing of integrated circuit 100 by transmitting signals to stimulate inputs and measure responses at outputs of the integrated circuit 100. The tester 10 includes a set of tester channels 20 that is coupled to integrated circuit 100 through interface 50. Tester 10 also includes an external reference clock 15 that may be used to clock time based testing of the integrated circuit 100. Interface leads 60 are used to couple interface 50 to I/O pads of a circuit block 105 to be wafer tested within integrated circuit 100. During packaged testing, interface leads 60 are used to couple interface 50 to package pins of integrated circuit 100, with the pins connected to I/O pads of circuit block 105 via bondpad wires.

Figure 2:
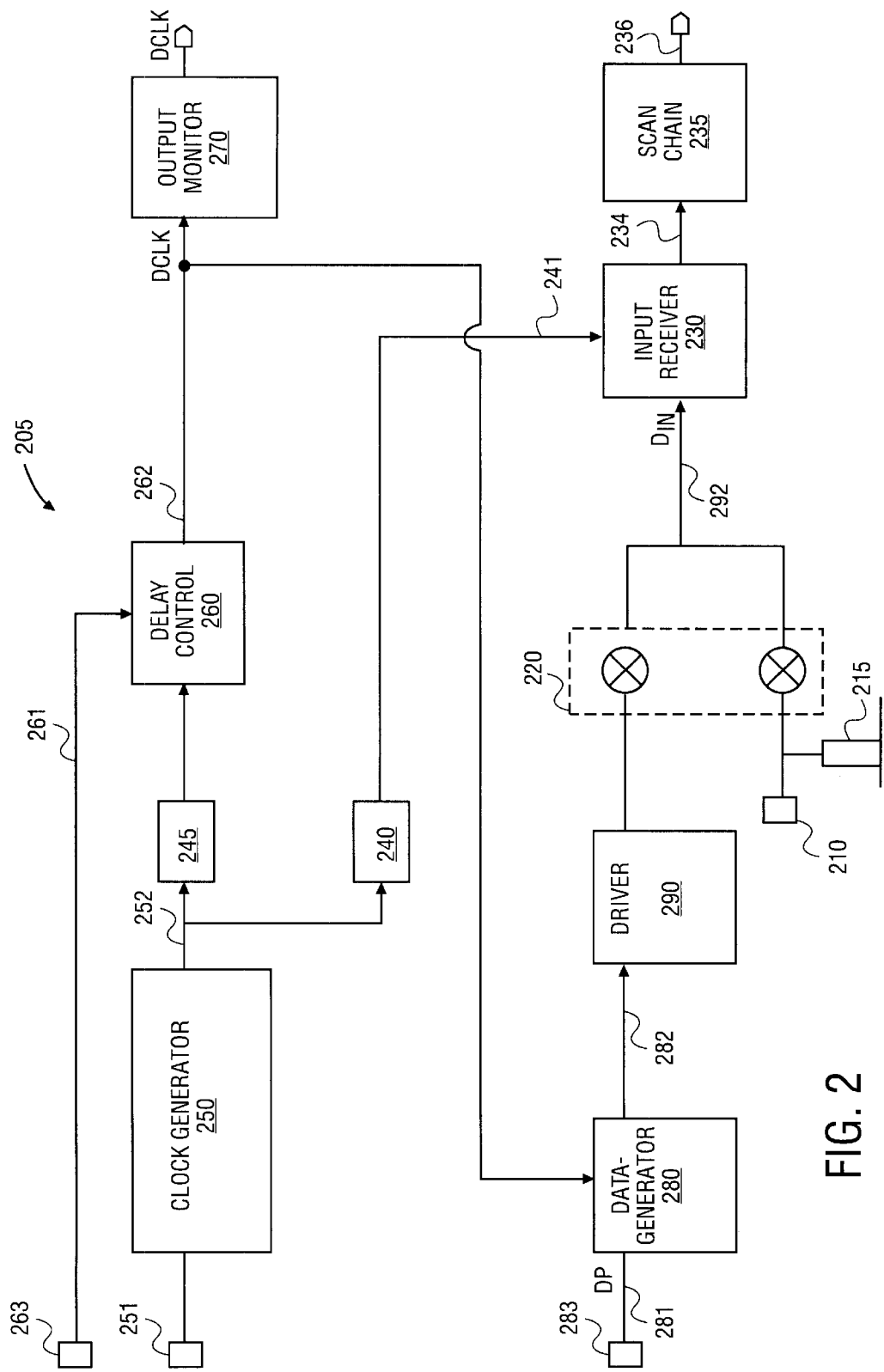
FIG. 2 illustrates one embodiment of an input data path testing scheme.

FIG. 2 illustrates one embodiment of an input data path testing scheme. In one embodiment, the data input path is from the input 292 to the output 234 of input receiver 230. It should be noted that the testing scheme described herein may be used with other types of input data path structures to test their timing parameters. The circuit block 205 includes an input pad 210, an output driver 215, an input multiplexer 220, an input receiver 230, buffers 240 and 245, a clock generator 250, a delay control 260, an output monitor 270, and a data generator 280.

Clock generator 250 generates a clock signal RCLK for data receive operations within integrated circuit 100 of FIG. 1. In one embodiment, clock generator 250 is a delay locked loop (DLL). In another embodiment, clock generator 250 may be other types of circuits generating a clock signal, for examples, a clock buffer and a phase locked loop (PLL). A DLL and a PLL are well known in the art; accordingly, a detailed description of their internal components and operation is not provided herein.

In normal circuit operations, clock generator 250 clocks output data being sent to an output driver (not shown) of the integrated circuit and clocks the input data being received on input pad 210. During testing of integrated circuit 100 for defects, clock generator 250 may be placed in a test mode by tester 10 to generate clock signals that are used to measure I/O timing parameters, for examples, setup (Tsh) and hold (Th) times of an input data path. When in the test mode, data generator 280 is used to generate a logic pattern to be used to evaluate the timing parameters of the input data path. The logic pattern is driven into input receiver 230 on input 292 and clocked with input 241 by clock generator 250. The output 234 of input receiver 230 is driven into scan chain 235 that evaluates the logic pattern.

Scan chain 235 contains a number of concatenated storage elements for testing sequential logic circuitry. Scan chain 235 outputs the results of the logic pattern applied to the scan chain. The output (Q) 236 of scan chain 235 is monitored to determine whether a pass or a fail condition occurs as is discussed in further detail below. A scan chain is well known in the art; accordingly, a detailed description of its internal components and operation is not provided herein.

Data generator 280 provides a logic pattern to scan chain 235 in order to test the timing parameters of the input data path. In one embodiment, data generator 280 contains a toggle flip-flop that sets up a desired pattern to be tested based on a signal DP 281 transmitted from tester 10 of FIG. 1 to I/O pad 283. Data generator 280 may produce, for examples, a pattern of all 0's, a pattern of all 1's, or a pattern of alternating 0's and 1's. Data generator 280 may be set to provide different data pattern bytes to evaluate their relative settings for the delay lines that cause one pattern to fail relative to another pattern. If one fails a predetermined time earlier than others, this indicates a possible defect in the input data path.

Delay control 260 is used to generate a delay clock signal (DCLK) 262 from clock signal (RCLK) 252. Delay control 260 is a programmable delay line that provides different clocking times to data generator 280. The amount of delay is adjusted by tester 10 of FIG. 1 using control input 261 that is coupled to the tester through I/O pad 263. The RCLK 252 is applied to the input of delay control 260 to be used in the test mode and to data generator 280 when delay control 260 is shut off during normal operation. In one embodiment, delay control 260 is a multi-tap delay circuit of parallel capacitors that may be selected or deselected to add or remove delay as is well known in the art. In another embodiment, delay control 260 may be another type of variable delay circuit. In one embodiment, RCLK is driven by buffers 240 and 245. Buffers 240 and 245 are inverters that are sized to drive RCLK at a desired edge rate.

Figures 3A, 3B:
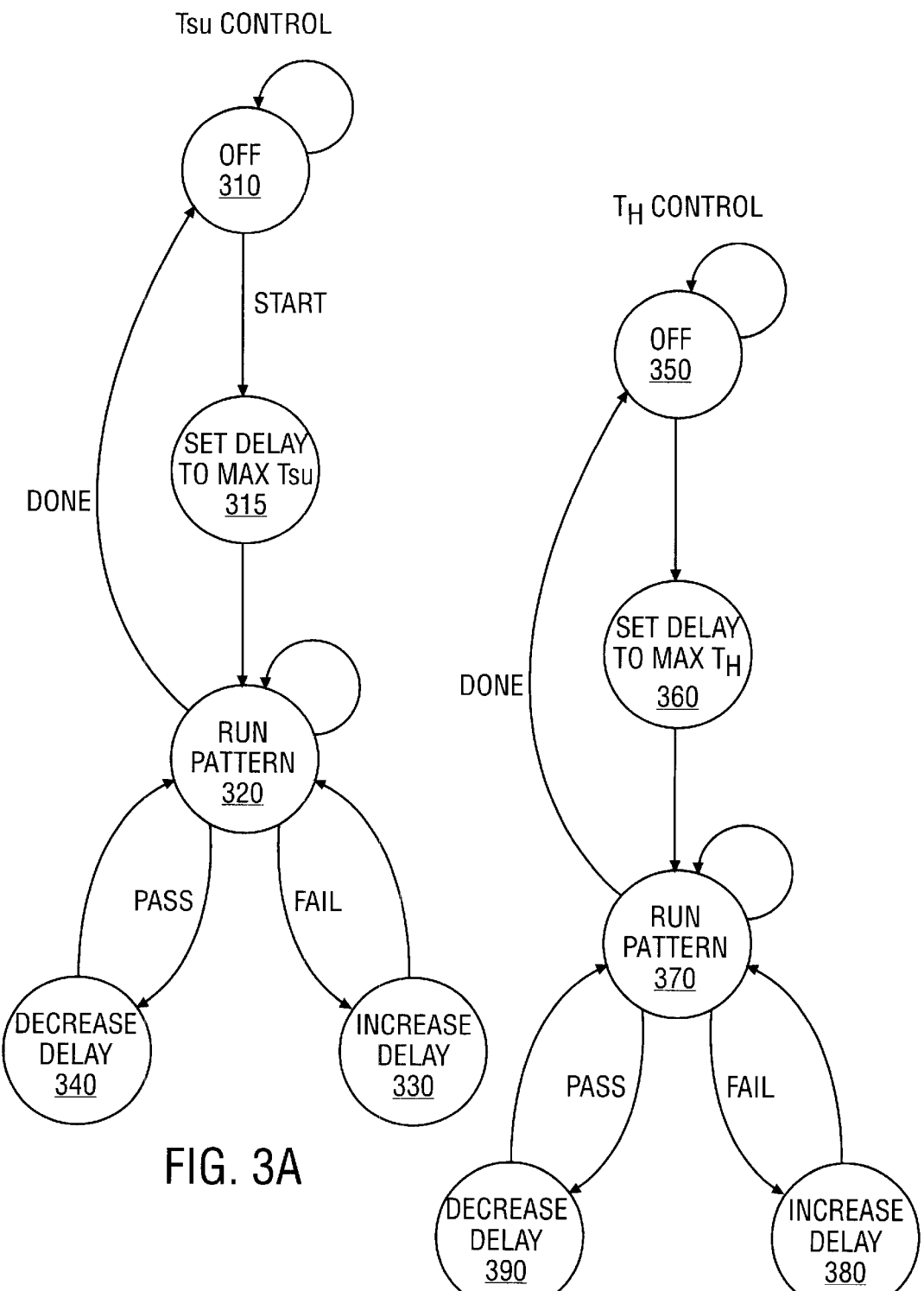
FIG. 3A illustrates a state diagram of one embodiment of the input data path test sequence.
FIG. 3B illustrates a state diagram of another embodiment of the input data path test sequence.

FIG. 3A illustrates a state diagram of one embodiment of the input data path test sequence. In normal operation, the delay control is turned off, state 310. During test mode operation, the delay control is activated and set to have a delay of approximately the maximum setup time required for the input data path, state 315. The output of the delay control is measured relative to the external reference clock 15 of FIG. 1 and stored as a base measurement. A pattern generated by the data generator is run through the scan chain, state 320 and the output of the scan chain is monitored.

If a pass condition is detected at the output of the scan chain, the setup time is decreased, state 340, using the delay control. The pattern is run again and the output of the scan chain is checked to see if a pass condition still results. This cycle is repeated until the setup time is decreased to a point where a fail condition results at the scan chain output. The output DCLK of the delay control is measured relative to the external reference clock 15 of FIG. 1 and compared against the base measurement. When the test sequence is complete, the delay control is turned off, state 310.

If a fail condition is detected at the output of the scan chain, the setup time is increased, state 330, using the delay control. The pattern is run again and the output of the scan chain is checked to see if a fail condition still exists. This cycle is repeated until the setup time is increased to a point where a pass condition results at the scan chain output. The output DCLK of the delay control is measured relative to external reference clock 15 of FIG. 1 and compared against the base measurement. When the test sequence is complete, the delay control is turned off, state 310. The difference between the current measurement and the base measurement is the setup time requirement of the input data path. Although the current and the base measurements have delays associated with the data generator 280 and driver 290 of FIG. 2, these delays are nulled by taking a difference measurement between them. The sequence may then be repeated using different data patterns.

FIG. 3B illustrates a state diagram of another embodiment of the input data path test sequence. In normal operation, the delay control is turned off, state 350. During test mode operation, the delay control is activated and set to have a delay of approximately the maximum hold time requirement, state 360. The output of the delay control is measured relative to external reference clock 15 of FIG. 1 and stored as a base measurement. A pattern generated by the data generator is run through the scan chain, state 370 and the output of the scan chain is monitored.

If a pass condition is detected at the output of the scan chain, the hold time is decreased, state 390, using the delay control. The pattern is run again and the output of the scan chain is checked to see if a pass condition still results. This cycle is repeated until the hold time is decreased to a point where a fail condition results at the scan chain output. The output DCLK of the delay control is measured and compared against the external reference clock 15 in tester 10 of FIG. 1. When the test sequence is complete, the delay control is turned off, state 350.

If a fail condition is detected at the output of the scan chain, the hold time is increased, state 380, using the delay control. The pattern is run again and the output of the scan chain is checked to see if a fail condition still exists. This cycle is repeated until the hold time is increased to a point where a pass condition results at the scan chain output. The output DCLK of the delay control is measured relative to the external reference clock 15 of FIG. 1 and compared against the base measurement. When the test sequence is complete, the delay control is turned off, state 350.

The difference between the current measurement and the base measurement is the hold time requirement of the input data path. The sequence may then be repeated using different data patterns. By measuring the timing parameters inside the integrated circuit 100, the measurements may not be affected by edge placement inaccuracies of tester 10.

Referring again to FIG. 2, delay control 260 is adjusted to move the edge of clock signal RCLK 252 around to find a setup and hold time that will make a particular data pattern fail relative to the setup and hold times of other data patterns. Because the setup and hold times are evaluated relative to each other, the programmable delay line does not have to compensate over temperature, voltage, and process variations. The resolution of the delay line need only be sufficient to test the input data path of the circuit block.

While in test mode operation, the output driver of integrated circuit 100 is shut off and input receiver 230 is isolated from input pad 210 using input multiplexer 220. The input multiplexer 220 selects between a signal on input pad 210 and the logic pattern transmitted from data generator 280. The input multiplexer 220 functions to decouple noise residing on input pad 210 from the input data path. Noise may be generated from various sources, for examples, driver circuitry and coupling from adjacent bondpad wires. In one embodiment, the input multiplexer 220 may be sized larger than functionally required in order to reduce the chance of processing defects in the multiplexer effecting the transmission of signals in the input data path.

The use of multiplexer 220 may add delay to the input data path. In one embodiment, the delay resulting from use of multiplexer 220, is canceled by placing a corresponding delay in a feedback path with clock generator 250. The output of multiplexer 220 is applied to input receiver 230.

Figure 4:
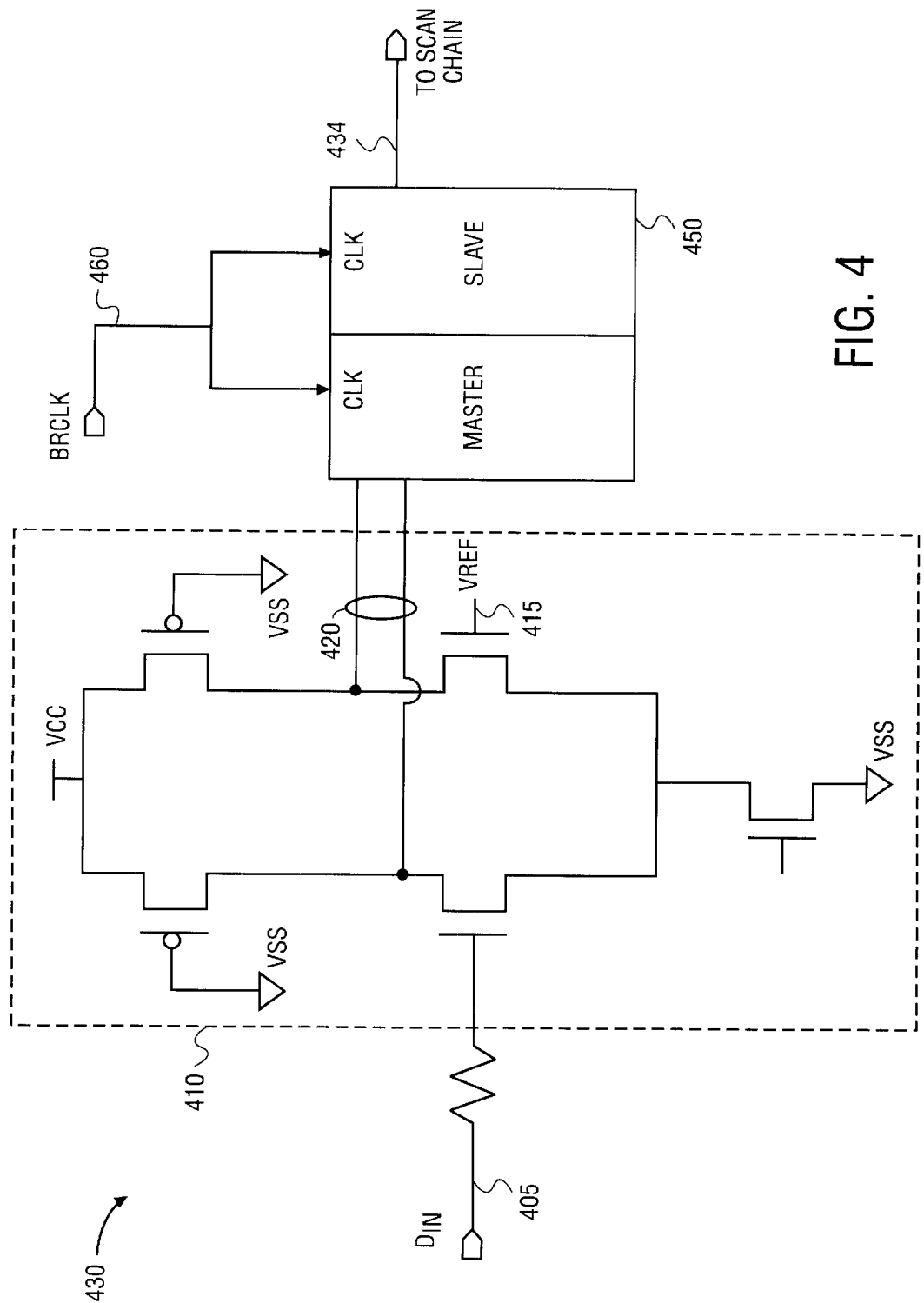
FIG. 4 illustrates one embodiment of an input receiver.

FIG. 4 illustrates one embodiment of an input receiver. The input receiver 430 includes a differential amplifier 410 and a master-slave flip-flop 450. Differential amplifier 410 senses the data (Din) at input 405 and generates a logic 1 or 0 based on a comparison to the reference voltage (VREF) 415. A buffered version (BRCLK) 460 of the receive clock signal transmitted from buffer 240 of FIG. 2 clocks the master-slave flip-flop 450 to capture the data at the output 420 of differential amplifier 410. The output 434 of the master-slave flip-flop 450 is transmitted to the scan chain 235 of FIG. 2.

In one embodiment, the setup time is the minimum time required for a signal to be applied at input pad 210 of FIG. 2 and propagated to flip-flop 450 before the flip-flop 450 is clocked. The hold time is the minimum time required to hold the data after applying the clock signal 460 to ensure that data remains in the flip-flop 450.

In an alternative embodiment, a converter (not shown) is located between the differential amplifier 410 and the master-slave flip-flop 450 to convert the small swing signals at the output of the differential amplifier 410 into full CMOS signals. In yet another embodiment, input receiver 430 includes a level shifter when the input signal swing is larger than the supply voltage range of input receiver 430.

A differential amplifier and a master-slave flip-flop are well known in the art; accordingly, a detailed description of their internal components and operation is not provided herein. It should also be noted that the input receiver 230 of FIG. 2 may have other configurations for sensing a logic input signal and generating a CMOS output signal as is well known in the art.

Figure 5:
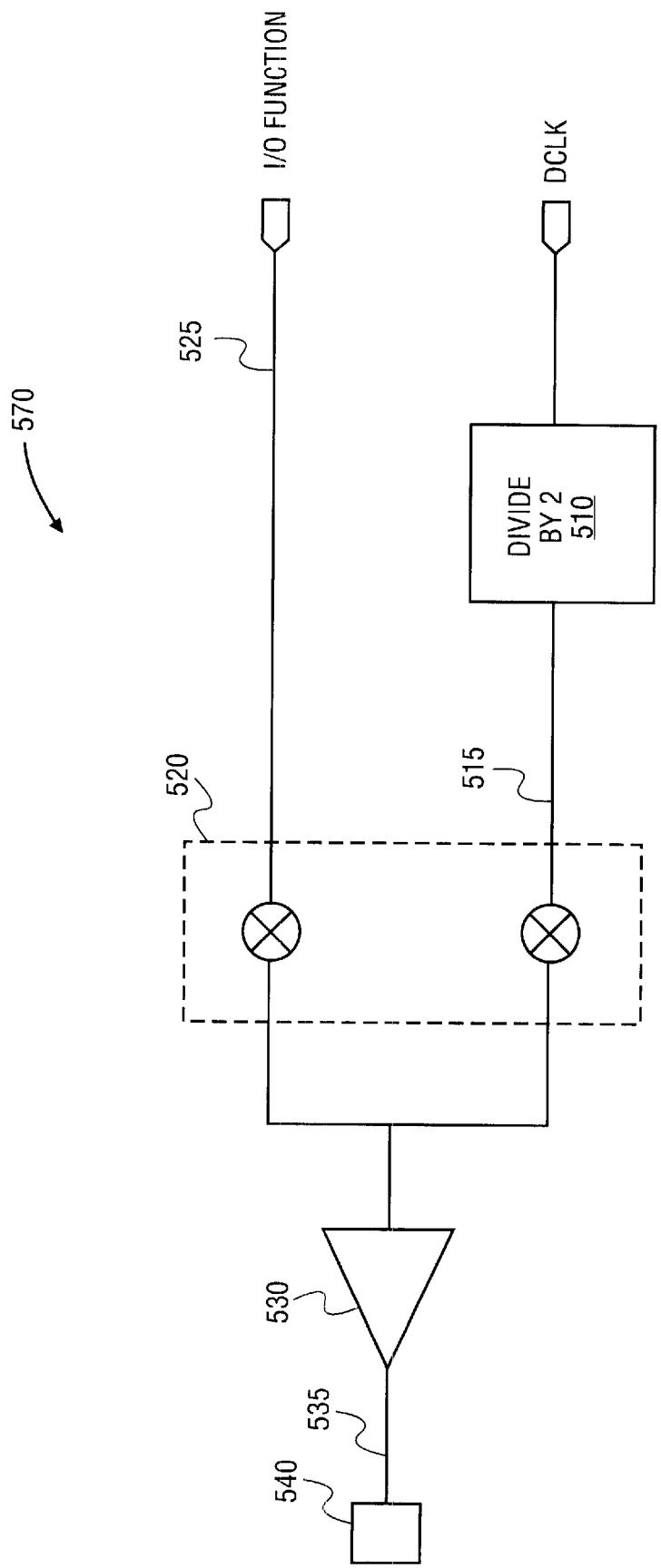
FIG. 5 illustrates one embodiment of an output monitor circuit.

FIG. 5 illustrates one embodiment of an output monitor circuit. Output monitor circuit 570 is used to monitor the setup and hold times as DCLK is variably delayed. In one embodiment, a divide by two circuit 510 is used to reduce the output speed of DCLK to a lower speed that is more easily measured by tester 10 of FIG. 1. In one embodiment, output 535 of the monitor circuit 570 is connected to an I/O pad 540, through output driver 530, that is utilized for other functions during normal operation of the integrated circuit. Because pad 540 is shared with other I/O circuit functions, a multiplexer 520 is used to select between the divide by two circuit output 515 and the output of the other I/O function 525.

Referring again to FIG. 2, data generator 280 provides a logic pattern to scan chain 235 in order to test the timing parameters of the data path. In one embodiment, driver 290 is a small swing converter used to convert CMOS signals from data generator 280 into small swing signals to be used by input receiver 230.

Figure 6:
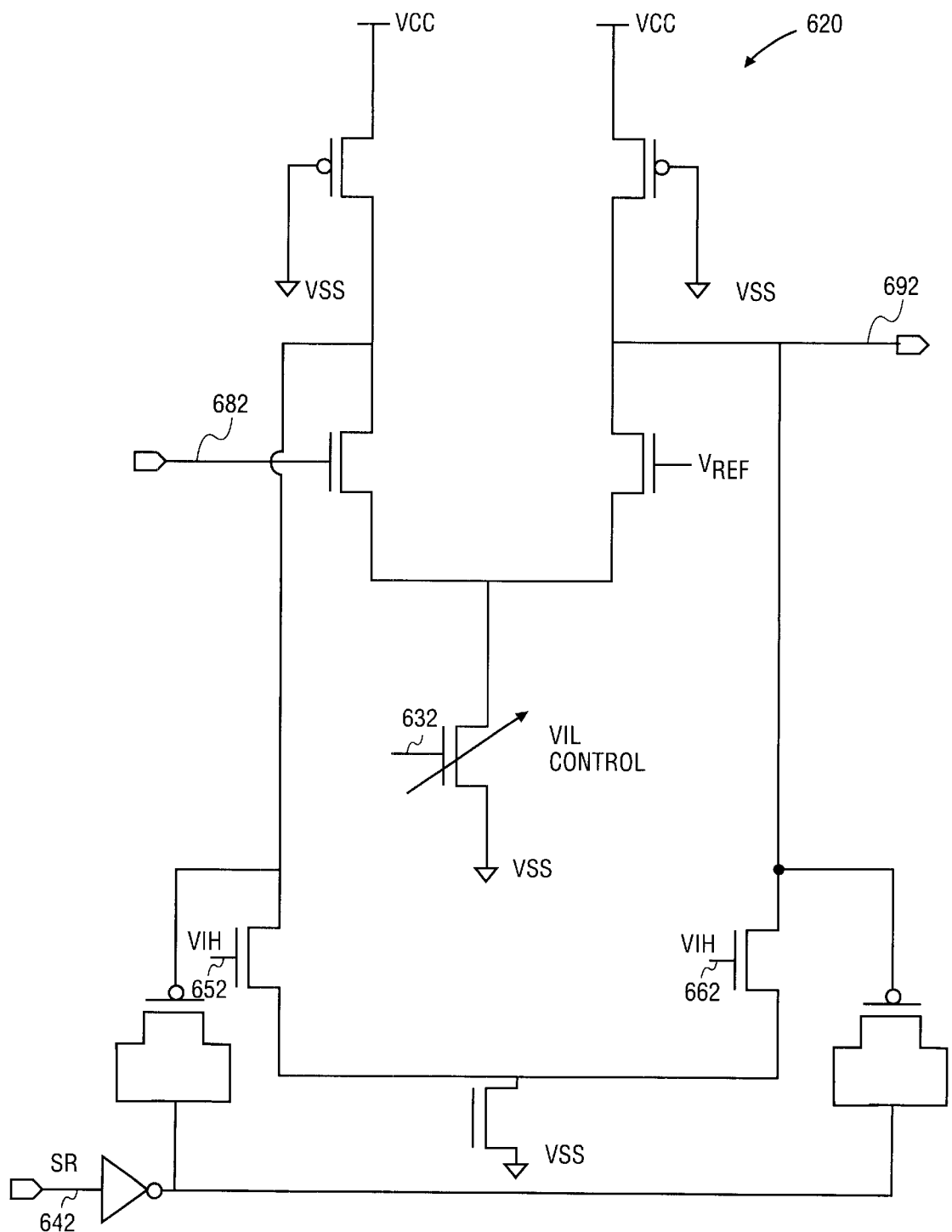
FIG. 6 illustrates one embodiment of a converter.

FIG. 6 illustrates one embodiment of a small swing converter. In one embodiment, the CMOS signals at input 682 are converted using a differential amplifier 620. Adjustments may be made to the voltages on input 682 and output 692 using VIL (voltage input low) control 632, slew rate (SR) control bit 642, and VIH (voltage input high) and VIH# inputs 652 and 662, respectively.

VIL control 632 may be used to adjust the tail current of the differential amplifier 620 to produce different VIL (voltage input low) levels on output 692. The VIH and VIH# inputs 652 and 662 may be used to provide a DC offset voltage for VIH and VIL levels on output 692. The output slew rate of differential amplifier 620 may be adjusted by toggling the slew rate control bit 642.

A differential amplifier is well known in the art; accordingly, a detailed description of its internal components and operation is not provided herein. It should be noted that configurations for the small swing converter other, than that shown in FIG. 6 may be used. In an alternative embodiment, a small swing converter is not used and driver 290 provides a buffered output of data generator 280 that may be applied directly to multiplexer 220 of FIG. 2.

Figure 7:
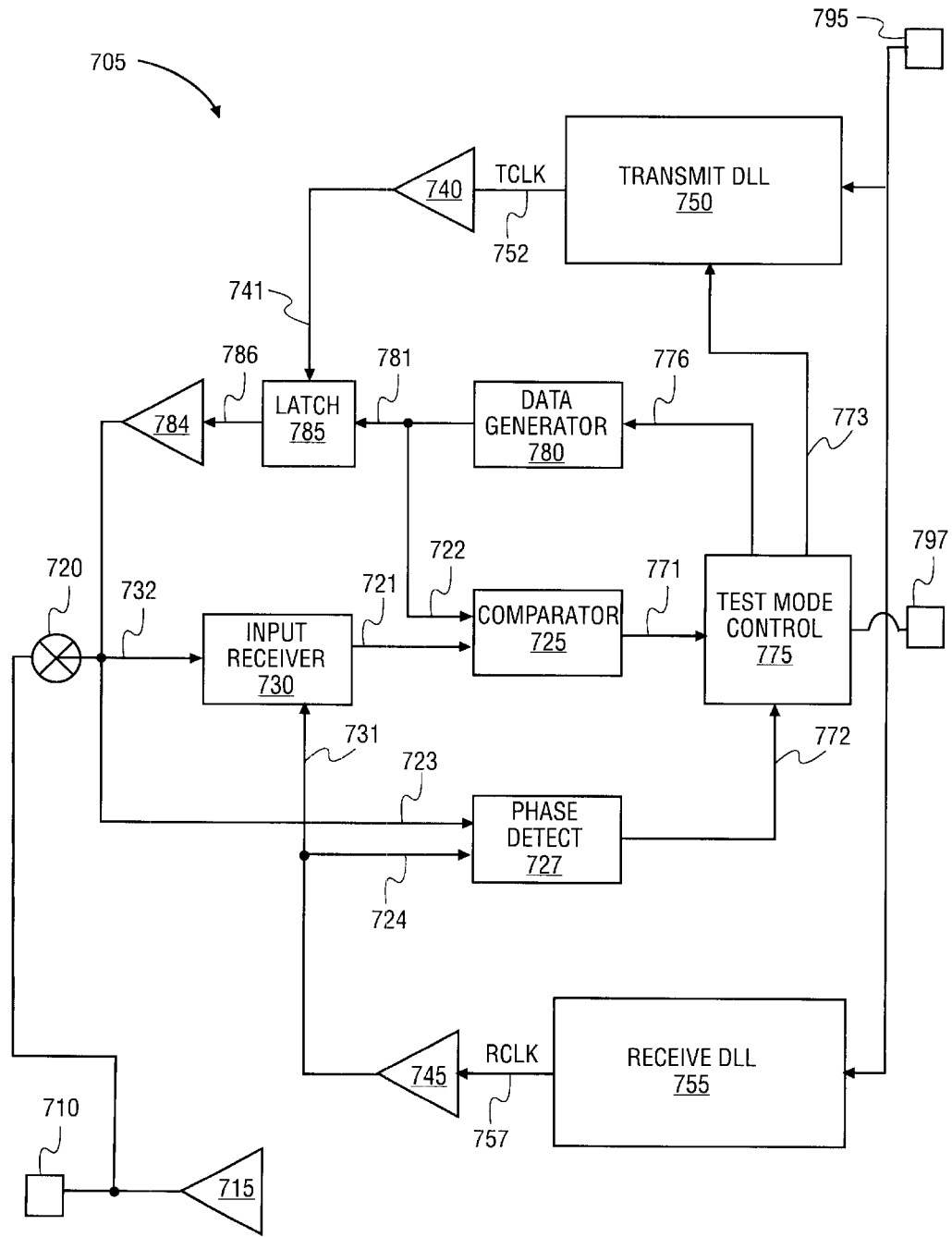
FIG. 7 illustrates an alternative embodiment of an input data path testing scheme.

FIG. 7 illustrates an alternative embodiment of an input data path testing scheme. It should be noted that the testing scheme described herein may be used with other types of I/O structures to test for variations in input receiver setup or hold times. The circuit block 705 includes a receive delay locked loop (DLL) 755, a transmit DLL 750, a test mode controller 775, a data generator 780, a comparator 725, a phase detector 727, a latch 785, an output driver 715, a transmit driver 740, a test mode driver 784, an input receiver 730, a receive driver 745, a multiplexer 720, and I/O pads 710, 795, and 797.

During normal circuit operation, transmit DLL 750 clocks output data being sent to output driver 715 and receive DLL 755 clocks input receiver 730, capturing data on I/O pad 710. Transmit driver 740 is used to drive TCLK 752 to the clock input 741 of latch 785. Receive driver 745 is used to drive RCLK 757 to the clock input 731 of input receiver 730. Both TCLK 752 and RCLK 757 are generated to have a known phase relation to external reference clock 15 of FIG. 1 for test mode purposes. The external reference clock is coupled to transmit DLL 750 and receive DLL 755 through I/O pad 795.

In test mode operation, output driver 715 is shut off and input receiver 730 is isolated from I/O pad 710 using multiplexer 720. Transmit DLL 750 and receive DLL 755 are used to measure I/O timing parameters, for examples, setup and hold times of an input data path. When in the test mode, data generator 780 is used to generate a logic pattern for evaluating the timing parameters of the input data path.

In one embodiment, data generator 780 is similar to data generator 280 of FIG. 2. Data generator 780 sets up a desired pattern to be tested based on a signal transmitted from test mode controller 775 to the input 776 of data generator 780. Data generator 780 may produce, for examples, a pattern of all 0's, a pattern of all 1's, or a pattern of alternating 0's and 1's. It should be noted again that a data generator is well known in the art; accordingly, a detailed description of its internal components and operation is not provided herein.

The pattern generated by data generator 780 is transmitted to the input 781 of latch 785. Latch 785 functions to provide a stable output based on the data transmitted to the latch at a time controlled by its clock input 741. In one embodiment, latch 785 is a master-slave flip-flop that is clocked by TCLK 752 on input 741. In another embodiment, latch 785 may be configured using other circuit techniques as are well known in the art.

The output 786 of latch 785 is driven by test mode driver 784 to the input 732 of input receiver 730. In one embodiment, test mode driver 784 is a small swing converter similar to the small swing converter described above in relation to driver 290 of FIG. 2. The small swing converter converts CMOS signals generated by the data generator 780 into small swing signals to be used by input receiver 730. In another embodiment, test mode driver 784 provides a buffered output of the CMOS signal from data generator 780 directly to the input receiver 730.

Input receiver 730 senses the signal applied at its input 732 and transmits latched logic signals on output 721 to comparator 725. In one embodiment, input receiver 730 is similar to the input receiver 230 described above in relation to FIG. 2. In another embodiment, input receiver 730 may have other configurations for sensing a logic input signal and generating a CMOS output signal.

Comparator 725 receives the output of data generator 780 at input 722 and the output of input receiver 730 at input 721. Comparator 725 compares the output of input receiver 730 with the output of data generator 780 to determine whether the two signals are approximately the same. If the signals on inputs 721 and 722 are approximately the same, a pass condition exits. If the signals on inputs 721 and 722 are determined by comparator 725 not to be the same, a fail condition exits. This pass or fail condition is transmitted to the input 771 of test mode controller 775 to be used in adjusting the delay of TCLK 752. A comparator is well known in the art; accordingly, a detailed description of its internal components and operation is not provided herein.

The phase detector 727 measures the phase difference between input 732 of input receiver 730 and the receive clock 731. Input 732 and RCLK 757 are received at the inputs 723 and 724, respectively, of phase detector 727. In one embodiment, the transmit DLL 750 operates independent of the receive DLL 755. As such, TCLK 752 can be programmed to have any arbitrary phase offset relative to the receive clock signal RCLK 757 generated by the receive DLL 755. This allows the signal on input 730 to have any phase offset relative to RCLK 757. The phases of TCLK 752 and RCLK 757 are measured by phase detector 727 and their phase difference is transmitted to input 772 of test mode controller 775. A phase detector is well known in the art; accordingly, a detailed description of its internal components and operation is not provided herein.

Test mode controller 775 functions to adjust the phase of TCLK 752 to be delayed in relation to RCLK based on the pass or fail condition detected by comparator 725. Phase detector 727 informs the test controller 775 whether the phase of TCLK 752 is early or late relative to the phase of RCLK 755 thereby enabling the test mode controller to increase or decrease the phase of TCLK 752 accordingly. In one embodiment, test mode controller 775 receives an external input from tester 10 of FIG. 1 that selects between a zero phase measurement state, a setup time state, and a hold state, as discussed below. The output 773 of test mode controller 775 is coupled to transmit DLL 750 to adjust the delay of TCLK 752. In one embodiment, transmit DLL 750 includes a multi-bit delay circuit where one or more bits may be selected or deselected to add or remove delay from TCLK 752.

Figure 8:
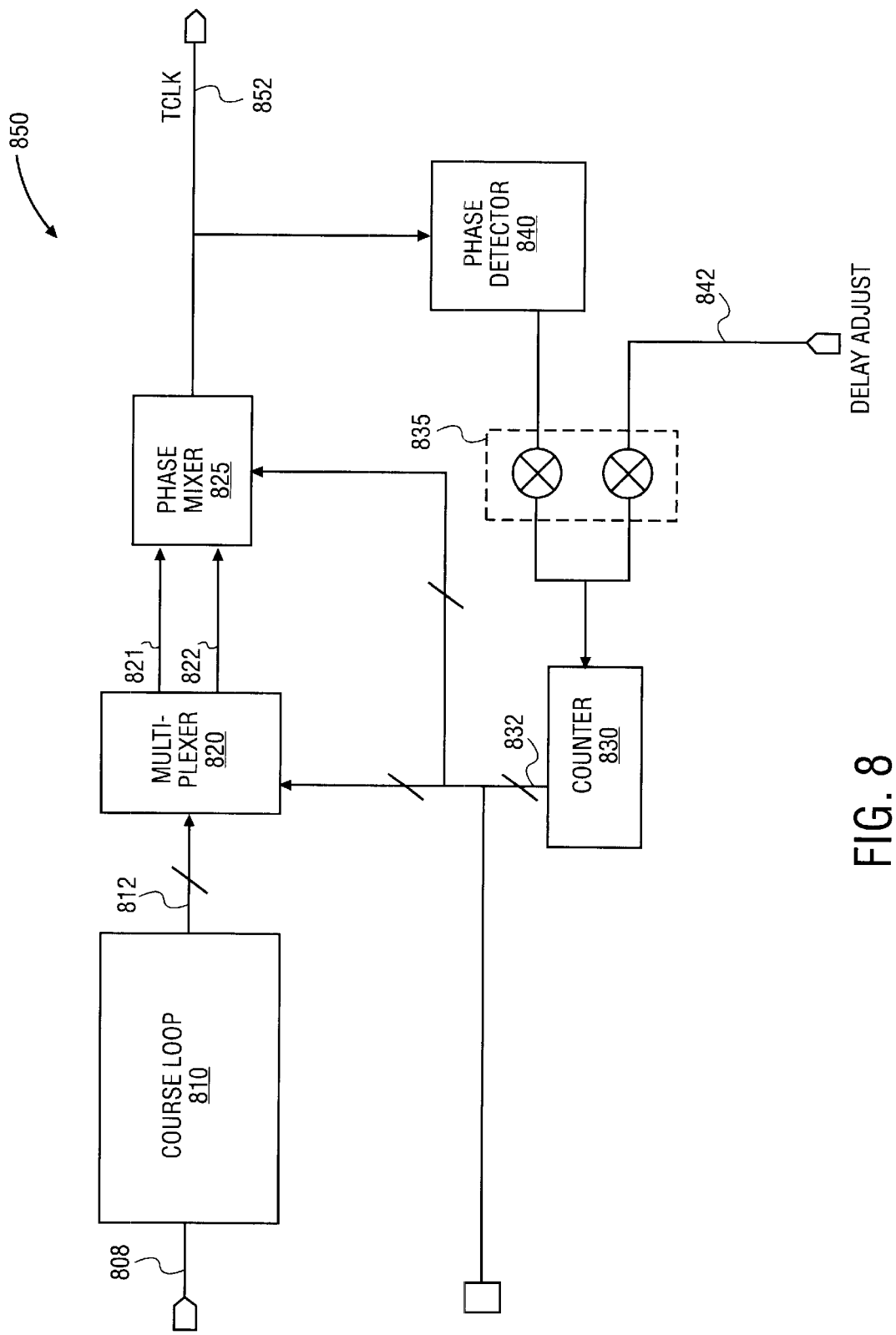
FIG. 8 illustrates one embodiment of a delay locked loop.

FIG. 8 illustrates one embodiment; of a DLL. In one embodiment, transmit DLL 850 is digitally controlled in the test mode in order to provide an internal clock having a certain phase relationship to external clock 15 of FIG. 1. Transmit DLL 850 includes a course loop 810 that generates a group of phase shifted clock signals 812 based on the external clock 15 signal applied at input 808. The group of phase shifted clock signals 812 have their phases equally spaced apart and are operated on by a finer loop control. The multiplexer 820 selects two adjacent clock signals out of group 812 and applies them to inputs 821 and 822 of phase mixer 825.

Phase mixer 825 uses phase interpolation to generate clock signal TCLK 852 having a phase in between the two clock signals 821 and 822 selected from group 812. Phase mixer 825 provides further resolution of TCLK by selecting a phase between the two clock signals applied to inputs 821 and 822 of phase mixer 825. The counter output 832 controls the multiplexer's 820 selection of two clock signals and the phase mixer's 825 interpolation between these two clock Signals. In one embodiment, counter output 832 is a multiple bit output with the most significant bits controlling multiplexer 820 and the least significant bits controlling phase mixer 825. Multiplexer 835 selects between phase detector 840 that is used to lock the delay loop and the delay adjust input 842 received from the test mode controller 775 of FIG. 7.

The test mode controller 775 of FIG. 7 transmits a signal on delay adjust input 842 that increments or decrements counter bits, thereby changing the phase increments of the TCLK signal generated by the transmit DLL 850. The phase increments generated within the transmit DLL 750 may result in a delay TCLK signal having an even finer resolution than may be achieved using the variable delay control 260 of FIG. 2. It should be noted that a course loop in a DLL, a phase mixer, and a counter are well known in the art; accordingly, a detailed description of their internal components and operation is not provided herein.

By adjusting the phase of TCLK 752, the test data pattern generated by data generator 780 during test mode operations may be switched at any offset relative to the input receiver 730 latching the test data. This allows for systematic testing and measurement of I/O timing parameters, for examples, setup and hold times of input data. By sending TCLK 752 having a phase offset from RCLK 757 to I/O pad 710, the measured timing parameters may be read by tester 10 of FIG. 1. In addition, by using the testing scheme described in relation to FIG. 7, overall test time may be further reduced by eliminating the time required to evaluate the data pattern using a scan chain.

Figures 9A, 9B:
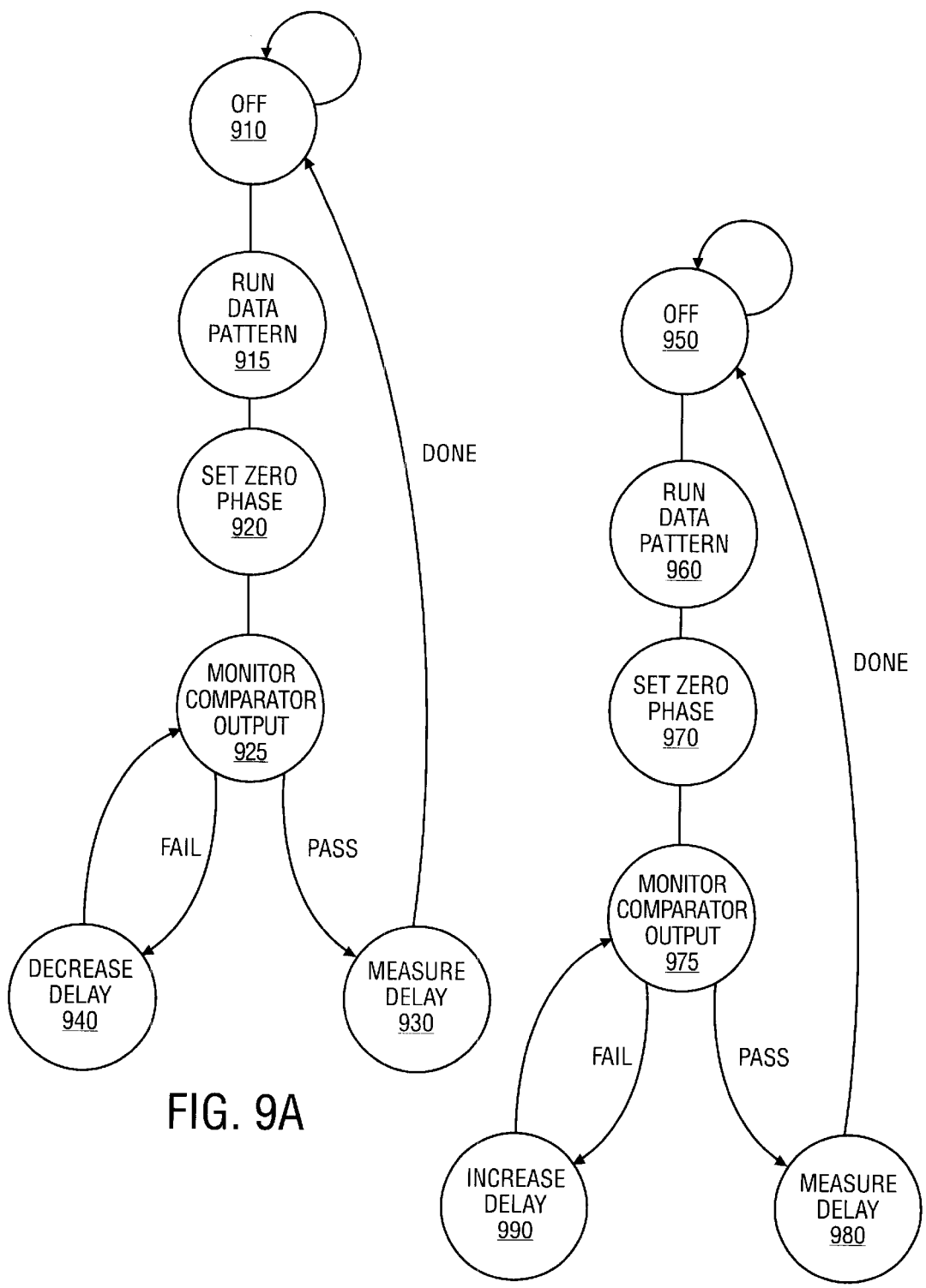
FIG. 9A illustrates an exemplary embodiment of a test mode sequence.
FIG. 9B illustrates another exemplary embodiment of a test mode sequence.

FIG. 9A illustrates a state diagram of an alternative embodiment of a test mode sequence. In one embodiment, the test mode sequence measures input data setup time. A data pattern is generated by the data generator, state 915. The delay of TCLK is adjusted by the test mode controller until the phase detector signals the test mode controller that a zero phase difference exists between the data pattern and RCLK, state 920. A zero phase difference between the data pattern and RCLK indicates that data is arriving on I/O pad 710 aligned with the receive clock. The DLL counter output 832 is driven to the I/O pad and measured by tester 10 of FIG. 1.

The data pattern propagated through the input data path and the output from the data generator are compared, state 925. The delay of TCLK is decreased by the test mode controller, state 940, until the phase of the transmit clock, TCLK precedes the receive clock early enough so that the input receiver latches a data pattern generated in a previous clock cycle. The DLL counter output is driven to the I/O pad and measured by tester 10 of FIG. 1, state 930. The difference between the zero phase measurement of the DLL counter output and the delay measurement of the DLL counter output is the input setup time. When the test sequence is complete, the delay control is turned off, state 910. The input setup time calculation may have an accuracy to within the phase difference between the external clock (not shown) and the internal receive DLL, the inaccuracies of the transmit DLL, and the error of phase detector.

FIG. 9B illustrates a state diagram of an alternative embodiment of a test mode sequence. In one embodiment, the test mode sequence measures input data hold time. A data pattern is generated by the data generator, state 960. The delay of TCLK is adjusted by the test mode controller until the phase detector signals the test mode controller that a zero phase difference exists between the data pattern and RCLK, state 970. A zero phase difference between the data pattern and RCLK indicates that data is arriving on the I/O pad aligned with the receive clock. The DLL counter output is driven to the I/O pad and measured by tester 10 of FIG. 1.

The data pattern propagated through the input data path and the output from the data generator are compared, state 975. The delay of TCLK is increased by the test mode controller, state 990, until the phase of the receive clock RCLK precedes the transmit clock early enough so that the input receiver latches a data pattern generated in a subsequent clock cycle. The DLL counter output is driven to the I/O pad and measured by tester 10 of FIG. 1, state 980. The difference between the zero phase measurement of the DLL counter output and the delay measurement of the DLL counter output is the input hold time. When the test sequence is complete, the delay control is turned off, state 950. The input hold time calculation may have an accuracy to within the phase difference between the external clock (not shown) and the internal receive DLL, the inaccuracies of the transmit DLL, and the error of phase detector.

In an alternative embodiment, the setup and hold times in relation to FIGS. 9A and 9B are calculated by measuring how many bits are used within counter 830 of FIG. 8 to generate TCLK resulting in a pass or fail condition.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for testing an input data path of an integrated circuit, comprising:
   setting a first timing parameter of a first clock signal to match a second timing parameter of a second clock signal, the first timing parameter having a first value;
   applying a data pattern to the input data path to produce an output based on the first and second timing parameters; and
   comparing the data pattern with the output of the input data path.

2. The method of claim 1, further comprising:
   adjusting the first timing parameter based on a result of the comparing, the adjusted first timing parameter having a second value; and
   measuring a difference between the first value of the first timing parameter and the second value of the first timing parameter.

3. The method of claim 2, wherein adjusting the first timing parameter comprises decreasing the first timing parameter.

4. The method of claim 3, wherein the difference is a setup time.

5. The method of claim 2, wherein adjusting the first timing parameter comprises increasing the first timing parameter.

6. The method of claim 5, wherein the difference is a hold time.

7. A method for testing an input data path of an integrated circuit, comprising:
   adjusting a delay of a first clock signal to approximately match a second clock signal, the first clock signal having a first value;
   applying a data pattern having a plurality of cycles to the input data path to produce an output; and
   comparing a first cycle of the plurality of cycles of the data pattern with the output of the input data path based on the second clock signal.

8. The method of claim 7, further comprising:
   adjusting the delay of the first clock signal until the output of the input data path approximately matches the data pattern having a cycle different from the first cycle of the data pattern, the first clock signal having a second value; and
   measuring the difference between the first and the second values of the first clock signal.

9. The method of claim 8, wherein adjusting the delay comprises decreasing the delay of the first clock signal until the output of the input data path approximately matches a cycle preceding the first cycle of the plurality of cycles of the data pattern.

10. The method of claim 9, wherein the difference between the first and the second values of the first clock signal is a setup time.

11. The method of claim 8, wherein adjusting the delay comprises increasing the delay of the first clock signal until the output of the input data path approximately matches a cycle subsequent to the first cycle of the plurality of cycles of the data pattern.

12. The method of claim 11, wherein the difference between the first and the second values of the first clock signal is a hold time.

13. A circuit for testing an input data path, comprising:
   a data generator to generate a data pattern;
   a latch coupled to receive the data pattern and a first clock signal, the latch to output the data pattern based on the first clock signal;
   an input receiver coupled to receive the latch output and generate a receiver output based on a second clock signal;
   a comparator coupled to the data generator and the input receiver, the comparator to compare the data pattern with the receiver output and generate an output; and
   a test mode controller coupled to receive the output of the comparator, the test mode controller to adjust the first clock signal based on the output of the comparator.

14. The circuit of claim 13, further comprising a phase detection circuit coupled to receive the first and a second clock signals, the phase detection circuit generating a phase difference output, the test mode controller coupled to receive the phase difference output and generate a difference measurement.

15. The circuit of claim 14, wherein the test mode controller adjusts the first clock signal until the phase difference output is zero.

16. The circuit of claim 14, wherein the test mode controller adjusts the first clock signal until the receiver output approximately matches the data pattern generated in a different cycle of the first clock signal.

17. The circuit of claim 14, further comprising:
   a first clock generator to generate the first clock signal; and
   a second clock generator to generate the second clock signal.

18. The circuit of claim 17, wherein the first and the second clock generators are delay lock loops.

19. The circuit of claim 18, further comprising a multiplexer to selectively couple an external input to the input receiver.

20. A circuit for testing an input data path, comprising:
   a data generator to generate a data pattern;
   an input receiver to generate a receiver output based on a second clock signal;
   a comparator coupled to the data generator and the input receiver, the comparator to compare the data pattern with the receiver output and generate an output; and
   a controller coupled to receive the output of the comparator, the controller to adjust a first clock signal based on the output of the comparator.

* * * * *